US012648088B2

(12) United States Patent
Naugle

(10) Patent No.: US 12,648,088 B2
(45) Date of Patent: Jun. 2, 2026

(54) CUSTOMIZABLE SENSOR CLUSTER SMART SWITCH

(71) Applicant: Nicholas Eli Naugle, Georgetown, TX (US)

(72) Inventor: Nicholas Eli Naugle, Georgetown, TX (US)

(73) Assignee: Adis Lujinovic, Katy, TX (US)

( * ) Notice: Subject to any disclaimer, the term of this patent is extended or adjusted under 35 U.S.C. 154(b) by 236 days.

(21) Appl. No.: 18/639,706

(22) Filed: Apr. 18, 2024

(65) Prior Publication Data

US 2025/0331110 A1      Oct. 23, 2025

Related U.S. Application Data

(60) Provisional application No. 63/468,537, filed on May 24, 2023.

(51) Int. Cl.
| | |
|---|---|
| *H05B 47/115* | (2020.01) |
| *H05K 5/00* | (2006.01) |
| *H05K 5/03* | (2006.01) |

(52) U.S. Cl.
CPC ......... *H05K 5/0017* (2013.01); *H05B 47/115* (2020.01); *H05K 5/03* (2013.01)

(58) Field of Classification Search
None
See application file for complete search history.

(56) References Cited

U.S. PATENT DOCUMENTS

| | | | | |
|---|---|---|---|---|
| 6,749,319 | B1 * | 6/2004 | Muse | F21V 33/00 |
| | | | | 362/802 |
| 11,201,444 | B1 * | 12/2021 | King | H04W 4/80 |
| 2007/0230415 | A1 * | 10/2007 | Malik | H04W 28/18 |
| | | | | 370/338 |
| 2007/0253437 | A1 * | 11/2007 | Radhakrishnan | G06F 15/16 |
| | | | | 370/392 |
| 2013/0301224 | A1 * | 11/2013 | Chu | H02G 3/14 |
| | | | | 361/728 |
| 2020/0352009 | A1 * | 11/2020 | Smith | H05B 47/1975 |
| 2021/0185789 | A1 * | 6/2021 | Smith | H05B 47/11 |
| 2021/0211319 | A1 * | 7/2021 | See | H04L 12/282 |
| 2023/0118062 | A1 * | 4/2023 | Bakk | H04W 4/33 |

* cited by examiner

*Primary Examiner* — Xanthia C Relford
*Assistant Examiner* — Xanthia C Cunningham

(57) ABSTRACT

A smart switch system and method are disclosed. The system includes a smart switch device and a cover plate. Further, the smart switch device includes a capacitive touch surface enabling a user interaction without physical pressure application and a dimmable light source within a front panel of the smart switch device. Further, the smart switch includes a mesh networking capability for a seamless communication with a plurality of devices, a rear connector facilitating integration with a plurality of custom sensor clusters, and a control unit for adjusting brightness levels of a dimmable light source based on the user interaction with the capacitive touch surface. Additionally, the cover plate includes a plurality of sensor clusters interchangeably connectable to the smart switch device with a cable.

7 Claims, 4 Drawing Sheets

CUSTOMIZABLE SENSOR CLUSTER SMART SWITCH

BACKGROUND

The smart switch market is of interest because it doesn't have any useful features that could be implemented to help save energy, improve security, and increase user functionality without complexity. The primary drawback of current smart switches is a waste of energy through performance loss and network interference within commercial/residential networking infrastructure. Moreover, automation and local control is not possible without the integration of multiple external sensors, usually battery powered, rendering traditional smart switches as a single use product.

Through the use of customizable sensor clusters embedded into the cover plate and mesh networking technology, the product would be able to connect to other smart devices from different manufacturers and relay temperature, humidity, occupancy, sound, CO2, VOC, etc. data to connected systems. Moreover, the sensors would help identify threats within large buildings in order to further assist safety operations.

Because of these defects, there is a need for a product that will allow complete user control over their smart switches, as well as offer a built-in dimmable light that can illuminate a whole room and accustomed sensor clusters embedded into the cover plate allowing for users to combine motion, sound, temperature, humidity, CO2 sensors and more to create energy savings and useful automation without needing multiple external devices.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments disclosed herein relate to a smart switch system. The smart switch includes a smart switch device and a cover plate. includes a smart switch device and a cover plate. Further, the smart switch device includes a capacitive touch surface enabling a user interaction without physical pressure application and a dimmable light source within a front panel of the smart switch device. Further, the smart switch includes a mesh networking capability for a seamless communication with a plurality of devices, a rear connector facilitating integration with a plurality of custom sensor clusters, and a control unit for adjusting brightness levels of a dimmable light source based on the user interaction with the capacitive touch surface. Additionally, the cover plate includes a plurality of sensor clusters interchangeably connectable to the smart switch device with a cable. Further, the sensor clusters include one or more sensors selected from a group consisting of a plurality of temperature sensors, a plurality of fire detection sensors, a plurality of motion sensors, a plurality of light sensors, a plurality of humidity sensors, a plurality of proximity sensors, and a plurality of air quality sensors In general, in one aspect, embodiments disclosed herein relate to a method for operating a smart switch system. Specifically, the method includes installing a smart switch device comprising a capacitive touch surface, a dimmable light source, and a rear connector for connecting custom sensor clusters and interchanging sensor clusters on the smart switch device, wherein said sensor clusters comprise one or more sensors selected from the group consisting of a plurality of temperature sensors, a plurality of fire detection sensors, a plurality of motion sensors, a plurality of light sensors, a plurality of humidity sensors, a plurality of proximity sensors, and a plurality of air quality sensors. Further, the method includes collecting data from connected sensor clusters, transmitting said data across a mesh network to other devices, and executing local automations based on the collected sensor data.

Other aspects and advantages of the claimed subject matter will be apparent from the following description and the appended claims.

BRIEF DESCRIPTION OF DRAWINGS

Specific embodiments disclosed herein will now be described in detail with reference to the accompanying figures. Like elements in the various figures are denoted by like reference numerals for consistency. Like elements may not be labeled in all figures for the sake of simplicity.

DETAILED DESCRIPTION

Figure 1:
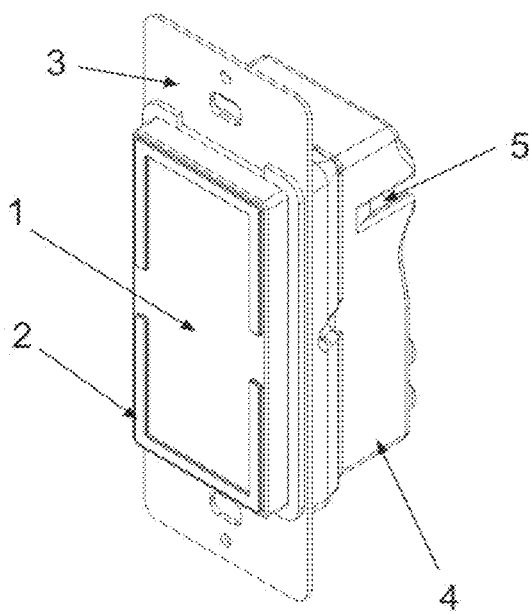
FIG. 1 shows the isometric view of a device from the front top right showing each of the external parts of the device in accordance with one or more embodiments.

In the following detailed description of embodiments disclosed herein, numerous specific details are set forth in order to provide a more thorough understanding disclosed herein. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers does not imply or create a particular ordering of the elements or limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-7, any component described with regard to a figure, in various embodiments disclosed herein, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a horizontal beam" includes reference to one or more of such beams.

Terms such as "approximately," "substantially," etc., mean that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

It is to be understood that one or more of the steps shown in the flowcharts may be omitted, repeated, and/or performed in a different order than the order shown. Accordingly, the scope disclosed herein should not be considered limited to the specific arrangement of steps shown in the flowcharts.

Although multiple dependent claims are not introduced, it would be apparent to one of ordinary skill that the subject matter of the dependent claims of one or more embodiments may be combined with other dependent claims.

Embodiments disclosed herein provide a smart switch that incorporates innovative design and advanced functionality, transforming the way traditional smart switches operate through the integration or combination of a smart sensor cover plate. In one or more embodiments, the device may allow users to control any load through a mesh networking topology, providing seamless control over a range of devices without the need for Wi-Fi connectivity. With the number of light switches required in all modern buildings, it is important that the light switches create the backbone of the building's mesh networking topology.

FIG. 1 shows that in some embodiments, the device also may include a built-in dimmable light that provides ample illumination for an entire room. Inside the front panel, the light dissipator 1, may dissipate the light coming from the circuit board and shine it through the front panel in component 2. The illumination pattern is around the switch as seen by location 2 to assist an individual in locating the switch or providing feedback. The light dissipator's 1 brightness level is remotely adjustable through a mobile application when the front surface is touched, making it ideal for both residential and commercial settings. It is also important for physically locating the device during the darker periods of the day to prevent injury in the dark.

The touch surface used is capacitive touch through the circuit board present within, allowing users to not actively apply any physical pressure when compared to traditional switches. The capacitive touch is compatible with all liquids and metals, allowing people with prosthetics to use the device without issue. When an interaction occurs with the touch surface, feedback is given by a temporary change in brightness from the built-in lights to show the device end user that a press event has occurred.

Figure 2:
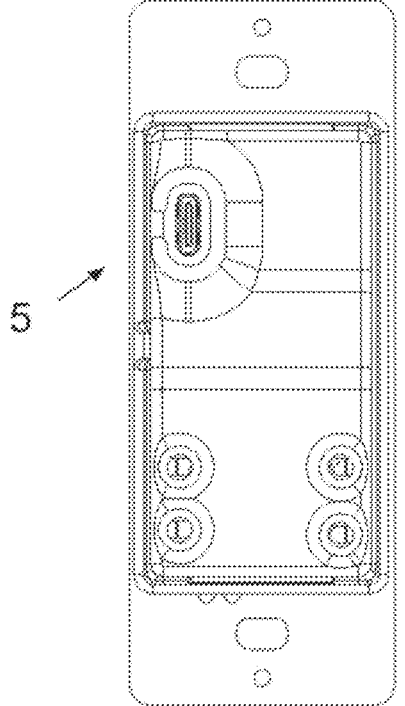
FIG. 2 shows the rear view of a device in accordance with one or more embodiments.
Figure 3:
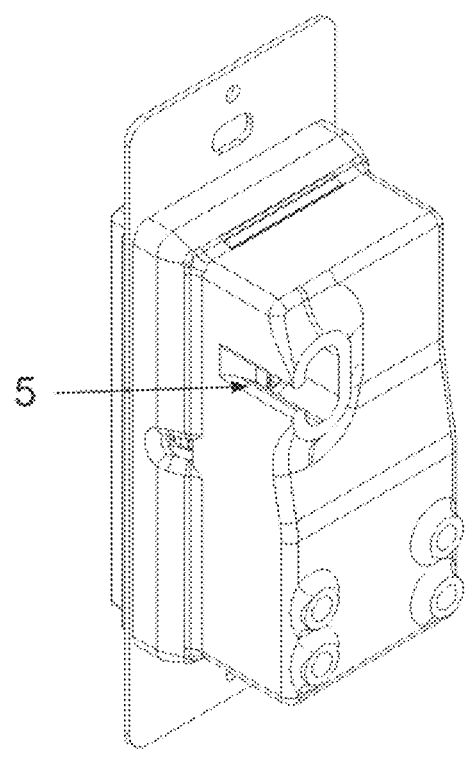
FIG. 3 shows the isometric view of a device from the rear top right in accordance with one or more embodiments.

The rear connector integrated into switch 5, also shown in FIGS. 2 and 3, enables the seamless integration of custom sensor clusters, component 6. Once these sensors are connected, the smart switch automatically retrieves data from the sensors in the cover plate and transmits it across the mesh network to other devices. This data can be utilized by hubs and other connected devices.

The rear connector of the smart switch, component 5, connects via a removable cable connection to a smart cover plate where the different sensor clusters are kept. These smart sensor cover plates can be changed at any time and the smart switch can automatically detect when new sensors are connected to the device.

After the switch successfully reads the sensor data from the smart sensor cover plate, it will send the data and control data to every other device connected to the mesh network.

Moreover, created automations can be run by the smart switch from the collected sensor data from the smart sensor cover plate. These automations can be run locally on the switch without needing a hub-related device or control other connected devices on the mesh network from the retrieved sensor data.

The smart sensor cover plate integration serves multiple purposes within different sensor cluster combinations. Combinations of different sensor clusters can exist and are not limited to the options listed below:

Temperature Sensors: These sensors capture ambient air temperature, allowing precise monitoring of temperature fluctuations in various locations where the switch is installed. This data aids HVAC units in regulating temperature and contributes to energy-efficient ventilation system management.

Fire Detection Sensors: With the ability to detect temperature changes, these sensors play a pivotal role in identifying potential fire outbreaks within buildings. Once triggered, they alert firefighting personnel through devices connected to the mesh network, assisting in the rapid identification of hotspots.

Motion Sensors: Integration of motion sensors enables the switch to detect movement within its vicinity. This functionality finds utility in security applications, facilitating the monitoring of spaces and alerting security systems to any unusual activity.

Light Sensors: By detecting ambient light levels, these sensors contribute to energy efficiency by controlling artificial lighting based on natural light availability. They help optimize energy consumption in buildings by adjusting lighting systems accordingly.

Humidity Sensors: These sensors measure humidity levels in the surroundings, assisting in maintaining optimal environmental conditions, especially in settings where humidity control is critical, such as laboratories or storage facilities.

Proximity Sensors: The integration of proximity sensors enables the switch to detect nearby objects or individuals, finding applications in automated doors, touchless switches, and occupancy detection in smart buildings.

Air Quality Sensors: Monitoring air quality parameters like $CO_2$ levels or pollutants helps in creating healthier indoor environments by regulating ventilation systems and alerting occupants if air quality deteriorates.

Each of these customizable sensors serves specific purposes and collectively contributes to enhancing building functionality, energy efficiency, safety measures, and overall occupant comfort within smart infrastructures.

Figure 4:
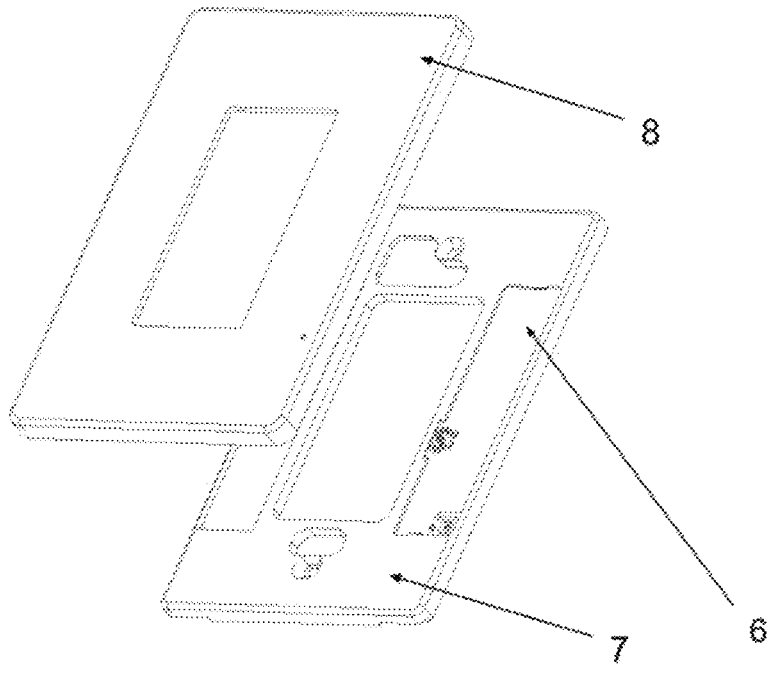
FIG. 4 shows the exploded view of a smart sensor cover plate with the internal and external parts in accordance with one or more embodiments.
Figure 5:
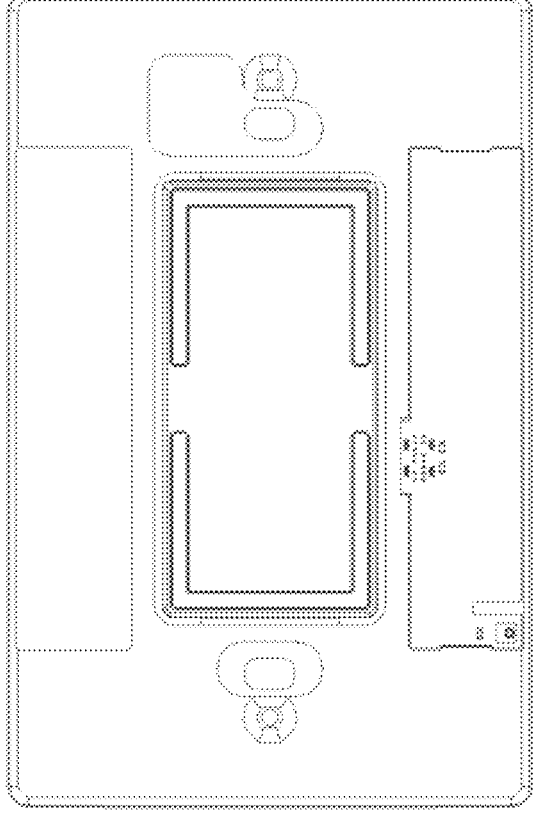
FIG. 5 shows the front view of the smart sensor cover plate mount over a smart switch in accordance with one or more embodiments.
Figure 6:
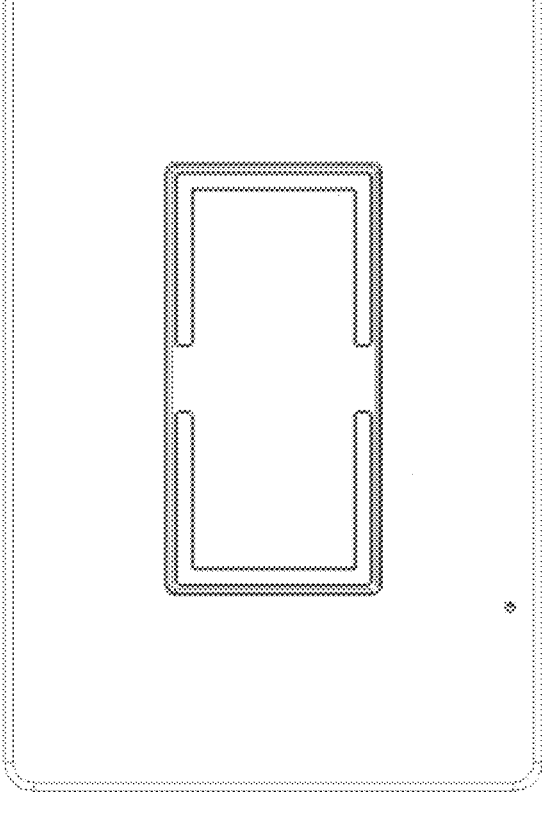
FIG. 6 shows the front view of the smart sensor cover plate over a smart switch concealing the smart sensor circuitry in accordance with one or more embodiments.

FIG. 4 shows that the sensor cluster is placed in component 6, which serves as a placeholder inside of component 7, the mount for the sensor cluster. Component 8 hides all of the sensors from plain view after the smart switch is installed to prevent tampering or inaccurate readings.

The mesh networking topology of the smart switch allows it to connect with other devices in the network, creating a seamless and integrated system that can be controlled from a central location. The switch's integrated design makes it easy to install and use, without the need for complicated setup or control systems and focuses on usability in whichever setting it is installed.

The actual construction of the device is done with components 1, 3, and 4, as well as circuit board(s) present within the device. Component 3 is designed to meet safety regulations required for this kind of device.

Figure 7:
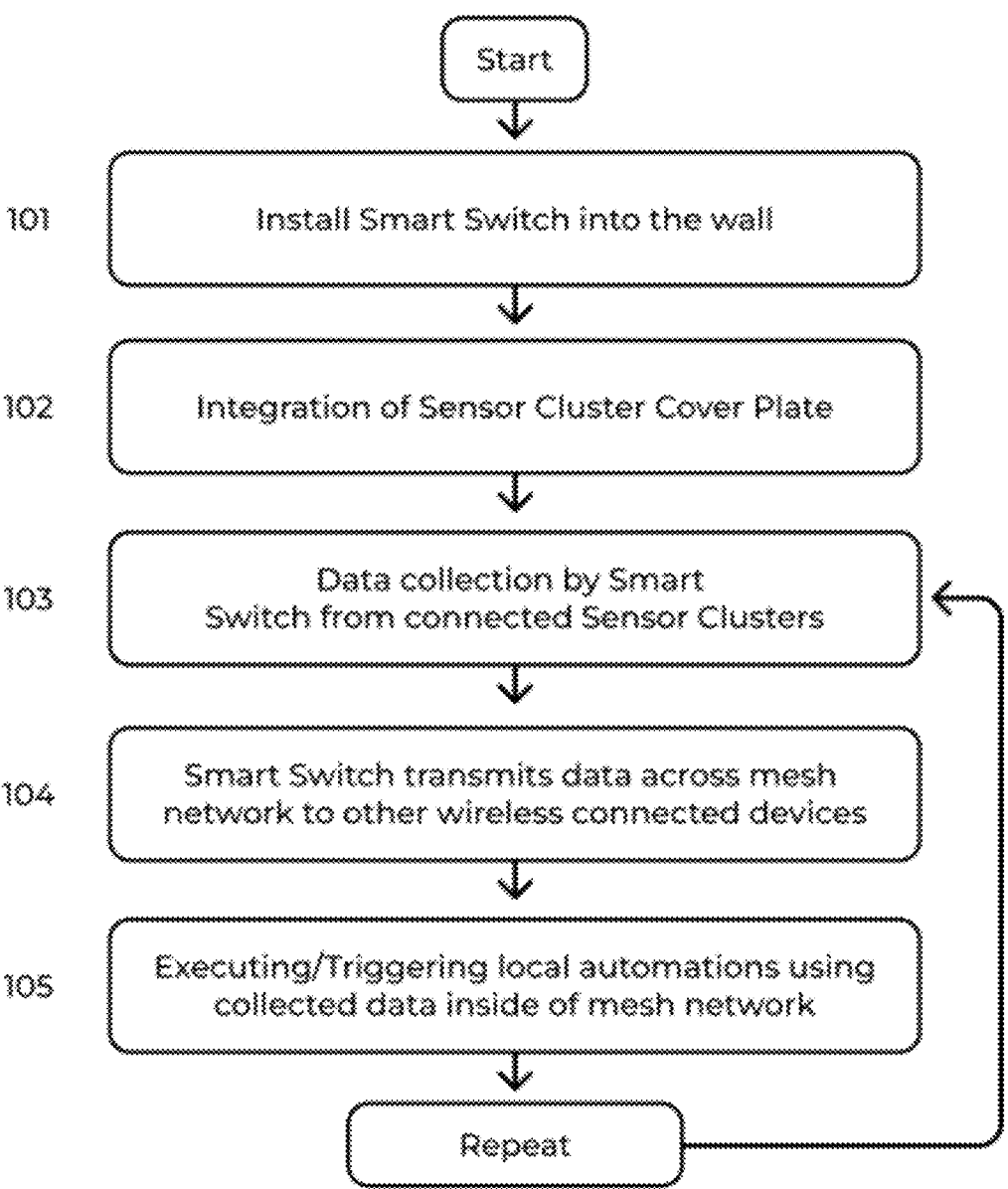
FIG. 7 shows a flowchart for the system method in accordance with one or more embodiments.

FIG. 7 describes a method for installing the Smart System, using each element described above. The process begins with Step 101, the installation of a smart switch device. The installation involves securely mounting the smart switch device in the desired location within a building or structure using typical switch mounting methods that are standard in the industry.

Step 102, after the smart switch device is installed, the next step involves the interchange of sensor clusters. These sensor clusters are specialized modules embedded in the cover plate that contain various sensors capable of detecting specific environmental conditions or events. The user has the flexibility to select and install sensor clusters tailored to their specific needs and preferences by connecting it to the installed switch from Step 101. These sensors can include but are not limited to temperature sensors, fire detection sensors, motion sensors, light sensors, humidity sensors, proximity sensors, and air quality sensors.

Step 103, With the sensor clusters in place, the smart switch device begins to collect data from the connected sensors from Step 102. These sensors continuously monitor and gather information related to the surrounding environment, such as temperature, motion, light levels, humidity, proximity, air quality, and fire detection.

Step 104, Transmitting Data Across Mesh Network: Once the data is collected from the sensor clusters through Step 103, the smart switch device utilizes its mesh networking capabilities to transmit this data to other devices within the network. The mesh network provides a reliable and efficient means of communication, allowing seamless data transmission between interconnected devices located throughout the building or structure.

Step 105, Executing Local Automations: The collected sensor data serves as valuable input for executing local automations within the smart ecosystem. These automations are pre-defined actions or responses triggered by specific conditions or events detected by the sensors and are stored locally on each smart switch. For example, the system may automatically adjust lighting levels based on ambient light conditions, activate fire alarms in response to detected smoke or high temperatures, control other devices connected on the mesh network, or adjust HVAC settings based on temperature and humidity levels acquired from its connected sensors or other sensor data acquired from the mesh network in Step 104.

What is claimed is:

1. A smart switch system comprising:
   a smart switch device comprising:
      a capacitive touch surface enabling a user interaction without physical pressure application;
      a dimmable light source within a front panel of the smart switch device;
      a mesh networking capability for a seamless communication with a plurality of devices;
      a rear connector facilitating integration with a plurality of custom sensor clusters; and
      a control unit for adjusting brightness levels of the dimmable light source based on the user interaction with the capacitive touch surface, and
   a cover plate comprising:
      a plurality of sensor clusters interchangeably connectable to the smart switch device with a cable,
   wherein the sensor clusters comprise one or more sensors selected from a group consisting of a plurality of temperature sensors, a plurality of fire detection sensors, a plurality of motion sensors, a plurality of light sensors, a plurality of humidity sensors, a plurality of proximity sensors, and a plurality of air quality sensors.

2. The smart switch system of claim 1, wherein the capacitive touch surface is compatible with liquids and metals, including operation by the users with prosthetics.

3. The smart switch system of claim 1, wherein the dimmable light source emits an illumination pattern around the switch for facilitating user identification and feedback.

4. The smart switch system of claim 1, wherein the rear connector of the smart switch device is detachably connectable with a physical cable to the sensor clusters, allowing for easy replacement and automatic detection of newly connected sensors.

5. The smart switch system of claim 1, wherein the control unit is further comprising a capability for:
   retrieving data from the connected sensor clusters;
   transmitting the retrieved data across a mesh network to the plurality of devices; and
   executing a plurality of local automations based on the transmitter sensor data.

6. The smart switch system of claim 1, wherein the smart switch device comprises components designed to meet safety regulations for electrical devices.

7. A method for operating a smart switch system, comprising:
   installing a smart switch device comprising a capacitive touch surface, a dimmable light source, and a rear connector for connecting custom sensor clusters;
   interchanging sensor clusters on the smart switch device, wherein said sensor clusters comprise one or more sensors selected from the group consisting of a plurality of temperature sensors, a plurality of fire detection sensors, a plurality of motion sensors, a plurality of light sensors, a plurality of humidity sensors, a plurality of proximity sensors, and a plurality of air quality sensors;
   collecting data from connected sensor clusters;
   transmitting said data across a mesh network to other devices; and
   executing local automations based on the collected sensor data.

\* \* \* \* \*